United States Patent
Sahara

(10) Patent No.: US 10,630,252 B2
(45) Date of Patent: Apr. 21, 2020

(54) AUDIO SIGNAL PROCESSOR AND METHOD OF PROCESSING AUDIO SIGNAL

(71) Applicant: Yamaha Corporation, Hamamatsu-shi, Shizuoka-Ken (JP)

(72) Inventor: Takuya Sahara, Kosai (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 16/371,247

(22) Filed: Apr. 1, 2019

(65) Prior Publication Data
US 2019/0229692 A1    Jul. 25, 2019

Related U.S. Application Data

(63) Continuation of application No. PCT/JP2017/036411, filed on Oct. 6, 2017.

(51) Int. Cl.
| | |
|---|---|
| *H03G 3/30* | (2006.01) |
| *H03F 3/04* | (2006.01) |
| *H03F 3/00* | (2006.01) |
| *H03G 3/02* | (2006.01) |
| *H03G 3/00* | (2006.01) |

(Continued)

(52) U.S. Cl.
CPC ........... *H03G 3/3089* (2013.01); *H03F 3/005* (2013.01); *H03F 3/04* (2013.01); *H03F 3/187* (2013.01); *H03F 3/45475* (2013.01); *H03G 3/00* (2013.01); *H03G 3/02* (2013.01); *H03F 2200/211* (2013.01); *H03F 2200/411* (2013.01); *H03G 2201/103* (2013.01); *H03G 2201/106* (2013.01)

(58) Field of Classification Search
CPC .......... H03G 3/3089; H03G 3/00; H03G 3/02; H03G 2201/103; H03G 2201/106; H03G 3/10; H03G 3/18; H03G 3/20; H03G 3/30; H03G 3/3026; H03F 3/005; H03F 3/04; H03F 3/187; H03F 3/45475; H03F 2200/211; H03F 2200/411
See application file for complete search history.

(56) References Cited

U.S. PATENT DOCUMENTS

2009/0274322 A1* 11/2009 Chang ................. H03G 9/005
                                                                 381/107

FOREIGN PATENT DOCUMENTS

JP    7-58567 A    3/1995

OTHER PUBLICATIONS

International Search Report (PCT/ISA/210) issued in PCT Application No. PCT/JP2017/036411 dated Dec. 26, 2017 with partial English translation (four (4) pages).

(Continued)

*Primary Examiner* — Mark Fischer
(74) *Attorney, Agent, or Firm* — Crowell & Moring LLP

(57) ABSTRACT

An audio signal processor includes a difference detecting circuit, a gain switching circuit, a differential gain value changing circuit, and a gain control circuit. The difference detecting circuit detects a differential gain value being a first total gain value being a gain value to be switched and a second total gain value being the gain value that has been switched. The gain switching circuit switches the first total gain value to the second total gain value. The differential gain value changing circuit decreases the differential gain value as time passes. The gain control circuit corrects an inputted signal with the differential gain value that decreases as time passes.

19 Claims, 11 Drawing Sheets

(51) Int. Cl.
*H03F 3/45* (2006.01)
*H03F 3/187* (2006.01)

(56) References Cited

OTHER PUBLICATIONS

English translation of document C1 (International Search Report (PCT/ISA/210) previously filed on Apr. 1, 2019) issued in PCT Application No. PCT/JP2017/036411 dated Dec. 26, 2017 (three (3) pages).

* cited by examiner

FIG. 5

| STEP | ATTENUATION AMOUNT | DIFFERENTIAL GAIN VALUE |
|---|---|---|
| 1 | 0.05dB | 9.95dB |
| 2 | 0.05dB | 9.90dB |
| ⋮ | ⋮ | ⋮ |
| 199 | 0.05dB | 0.05dB |
| 200 | 0.05dB | 0dB |

FIG. 6

|  | BEFORE SWITCHING | AFTER SWITCHING |
|---|---|---|
| PAD1 | 0dB | 0dB |
| AMP1 | +5dB | +24dB |
| AMP2 | −6dB | −17dB |
| CORRECTION GAIN VALUE | +1dB | +3dB |
| TOTAL GAIN VALUE | 0dB | +10dB |

AUDIO SIGNAL PROCESSOR AND METHOD OF PROCESSING AUDIO SIGNAL

CROSS REFERENCE TO RELATED APPLICATIONS

The present application is a continuation of International Application No. PCT/JP2017/036411, filed on Oct. 6, 2017, the entire contents of which is incorporated herein by reference.

BACKGROUND OF THE INVENTION

1. Field of the Invention

A preferred embodiment according to the present invention relates to an audio signal processor and a method of processing an audio signal, and, in particular, to an audio signal processor and a method of processing an audio signal that process a signal.

2. Description of the Related Art

Conventionally, a level control circuit that is used for an electronic musical instrument (an audio device) and the like and changes a level of an analog input signal according to volume data being a digital value has been known (see Japanese Unexamined Patent Application Publication No. H07-058567, for example). The level control circuit configures two operational amplifiers, and two attenuators that have a plurality of resistors and a plurality of switches. The level control circuit controls ON and OFF of the plurality of switches. The two attenuators attenuate (change) the level of an analog input signal by an attenuation amount corresponding to each step. The two operational amplifiers amplify the signal attenuated by the two attenuators.

In an audio device (an audio signal processor), when the level (a gain value) of a signal is changed, noise may occur since a waveform sequence is broken. In the conventional art (Japanese Unexamined Patent Application Publication No. H07-058567, for example), any solution in a case in which such noise occurs has not been disclosed.

SUMMARY OF THE INVENTION

In view of the foregoing, an object of a preferred embodiment of the present invention is to provide an audio signal processor and a method of processing an audio signal that reduce noise that occurs when a gain value is switched.

An audio signal processor according to a preferred embodiment of the present invention includes a difference detecting circuit, a gain switching circuit, a differential gain value changing circuit, and a gain control circuit. The difference detecting circuit detects a differential gain value being a difference between a first total gain value and a second total gain value, the first total gain value being a gain value to be switched, the second total gain value being the gain value that has been switched. The gain switching circuit switches the first total gain value to the second total gain value. The differential gain value changing circuit decreases the differential gain value as time passes after the first total gain value is switched to the second total gain value by the gain switching circuit. The gain control circuit corrects an inputted signal with the differential gain value that decreases as the time passes after the first total gain value is switched to the second total gain value by the gain switching circuit.

According to an audio signal processor and a method of processing an audio signal according to a preferred embodiment of the present invention, noise that occurs when a gain value is switched is able to be reduced.

The above and other elements, features, characteristics, and advantages of the present invention will become more apparent from the following detailed description of the preferred embodiments with reference to the attached drawings.

BRIEF DESCRIPTION OF THE DRAWINGS

FIG. 5 is a correspondence table showing an example of a correspondence relationship among a step, a differential gain value (a variable gain value) that decreases for each step, and a differential gain value.

FIG. 6 is a correspondence table showing an example of a correspondence relationship between a gain value to be switched and a gain value that has been switched.

DETAILED DESCRIPTION OF THE PREFERRED EMBODIMENTS

An audio signal processor 1 and a method of processing an audio signal according to a present preferred embodiment of the present invention will be described with reference to FIG. 1 to FIG. 8.

The audio signal processor 1 is an audio mixer, for example, and receives a signal obtained by picking up sound with a microphone or the like. In general, the level of an audio signal obtained by picking up sound with a microphone is extremely small (about −60 to about −40 dBu). The audio signal processor 1 and the method of processing an audio signal perform signal processing on a signal of such a small level and amplify the audio signal that has been received. In the audio signal processor 1 and the method of processing an audio signal, in order to amplify an audio signal, an operation element, for example, a gain knob, is used and thus a gain value is changed.

Additionally, in the audio signal processor 1 and the method of processing an audio signal, a gain value is changed for each scene by use of a function called scene recall. In a scene recall function, the gain value is stored for each scene. In the scene recall function, a scene is switched when a scene selector switch configured by a push button switch and the like is pressed. As a result, in the scene recall function, the present gain value may be changed to a gain value after a scene is changed (after an update).

Figure 1:
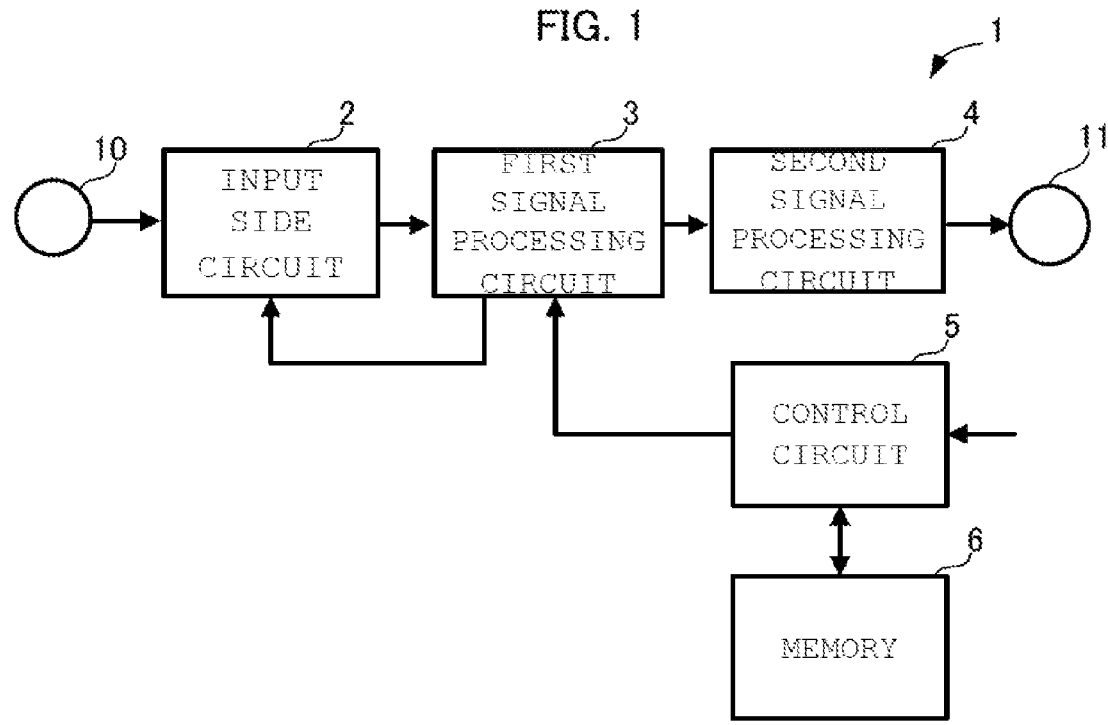
FIG. 1 is a block diagram showing the entire configuration of an audio signal processor.
Figure 2:
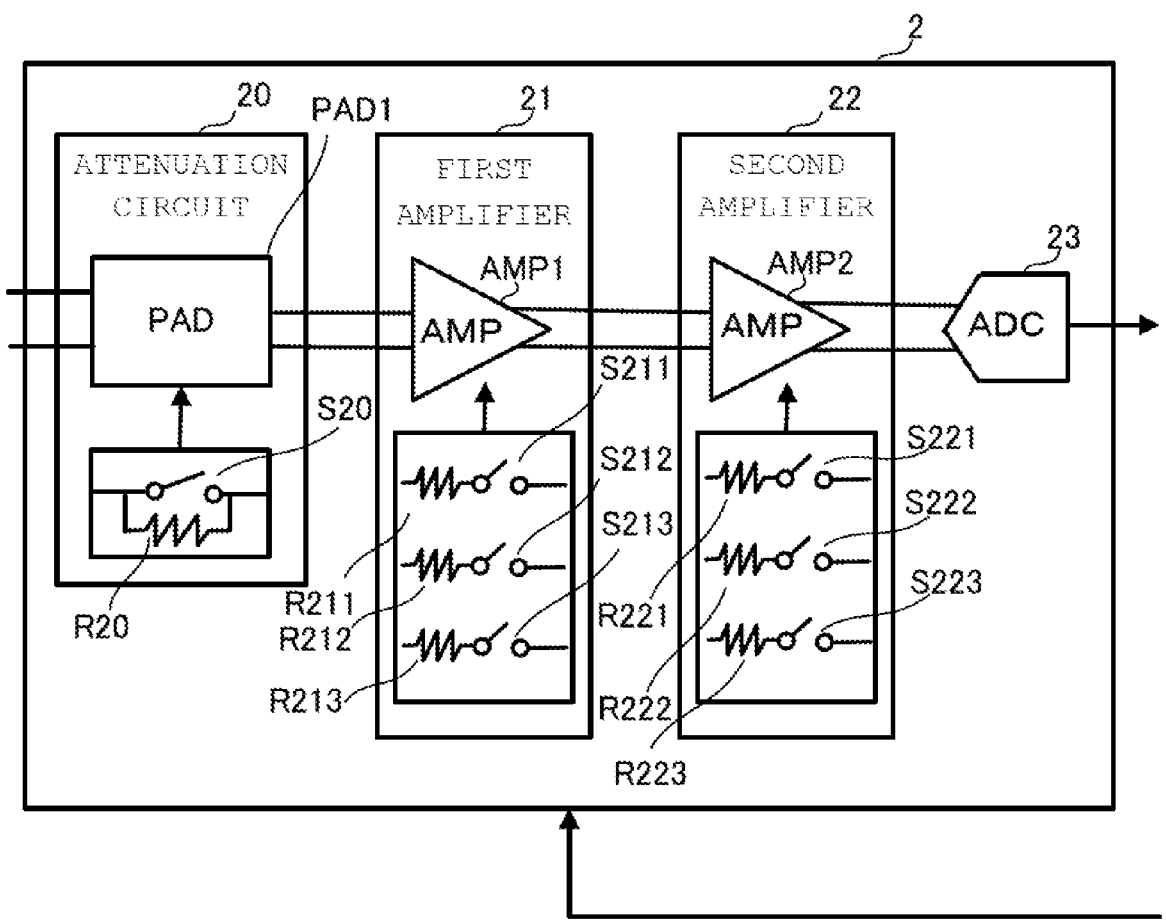
FIG. 2 is a block configuration diagram showing an input side circuit of the audio signal processor.
Figure 3:
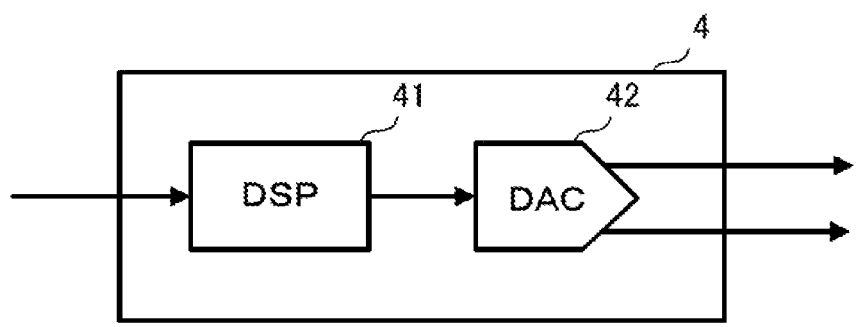
FIG. 3 is a block diagram showing an output side circuit of the audio signal processor.

First, the audio signal processor 1 will be described with reference to FIG. 1 to FIG. 7. FIG. 1 is a block diagram showing the entire configuration of the audio signal processor 1. FIG. 2 is a block configuration diagram showing an input side circuit 2 of the audio signal processor 1. FIG. 3 is a block diagram showing an output side circuit 4 of the audio signal processor 1.

The audio signal processor 1, as shown in FIG. 1, includes an input terminal 10, an input side circuit 2, a first signal processing circuit 3, an output side circuit (a second signal processing circuit) 4, a control circuit 5, and an output terminal 11. The audio signal processor 1 receives an analog audio signal obtained by picking up sound from a microphone or the like, through the input terminal 10. The audio signal processor 1 performs signal processing on an audio signal that has been received at the input side circuit 2, the first signal processing circuit 3, and the output side circuit 4, and outputs the audio signal on which the signal processing is performed, from the output terminal 11.

The input side circuit 2 receives an audio signal obtained by picking up sound with a microphone or the like, through the input terminal 10. The input side circuit 2, as shown in FIG. 2, includes an attenuation circuit 20, a first amplifier circuit 21, a second amplifier circuit 22, and an AD converter 23.

The attenuation circuit 20 receives an analog audio signal obtained by picking up sound from a microphone or the like, through the input terminal 10. The attenuation circuit 20 has an attenuator PAD1, a resistor R20, and a switching element S20. The resistor R20 and the switching element S20 are electrically connected to each other. The switching element S20 is controlled to an ON state or an OFF state, so that the attenuator PAD1 attenuates the analog audio signal that has been inputted through the input terminal 10. For example, when the switching element S20 is turned to the ON state, the attenuator PAD1 attenuates an inputted analog audio signal by −5 dB. The attenuation circuit 20 outputs an attenuated analog audio signal to the first amplifier circuit 21.

It is to be noted that the number of attenuators, resistors, switching elements that configure the attenuation circuit 20, is not limited to the example described above, and the attenuation circuit 20 may include two or more attenuators, resistors, and switching elements. In addition, the attenuation amount is not limited to the example described above, and the attenuation circuit 20 may attenuate an analog audio signal by an attenuation amount other than −5 dB.

The first amplifier circuit 21 receives the attenuated analog audio signal from the attenuation circuit 20. The first amplifier circuit 21 has a first amplifier AMP1, a plurality (three) of resistors R211, R212, and R213, and a plurality (three) of switching elements S211, S212, and S213. The plurality of resistors R211, R212, and R213 are electrically connected to the plurality of switching elements S211, S212, and S213 one-on-one. Each of the plurality of switching elements S211, S212, and S213 is controlled to the ON state or the OFF state, so that the first amplifier AMP1 amplifies the analog audio signal received from the attenuation circuit 20.

The first amplifier circuit 21 changes the amplification amount (the gain value) by a combination of the ON states of each of the plurality of switching elements S211, S212, and S213. Specifically, for example, in a case in which only the switching element S211 is in the ON state, the first amplifier AMP1 amplifies by 23 dB the analog audio signal that has been received from the attenuation circuit 20. Additionally, in another example, in a case in which all the switching elements S211, S212, and S213 are in the ON state, the first amplifier AMP1 amplifies by 44 dB the analog audio signal that has been received from the attenuation circuit 20. The first amplifier circuit 21 outputs the amplified analog audio signal to the second amplifier circuit 22.

It is to be noted that the number of resistors and switching elements of the first amplifier circuit 21 is not limited to the above-stated number, and the number may be two or less or may be four or more. Additionally, the amplification amount of the first amplifier circuit 21 is not limited to the above stated example and may be able to be changed by an amplifier that is used or an electronic circuit configuring the amplifier.

The second amplifier circuit 22 receives an analog audio signal from the first amplifier circuit 21. The second amplifier circuit 22 has a second amplifier AMP2, a plurality (three) of resistors R221, R222, and R223, and a plurality (three) of switching elements S221, S222, and S223. The plurality of resistors R221, R222, and R223 are electrically connected to the plurality of switching elements S221, S222, and S223 one-on-one. Each of the plurality of switching elements S221, S222, and S223 is controlled to the ON state or the OFF state, so that the second amplifier AMP2 attenuates a received analog audio signal.

It is to be noted that, as the first amplifier AMP1 and the second amplifier AMP2, an attenuator may be used in place of an amplifier as long as the attenuator is able to generate the first total gain.

The second amplifier circuit 22 changes the attenuation amount (the gain value) by a combination of the ON states of each of the plurality of switching elements S221, S222, and S223. Specifically, for example, in a case in which only the switching element S221 is in the ON state, the second amplifier AMP2 attenuates by −10 dB the analog audio signal that has been received from the first amplifier circuit 21. Additionally, in another example, in a case in which all the switching elements S221, S222, and S223 are in the ON state, the second amplifier AMP2 attenuates by −22 dB the analog audio signal that has been received from the first amplifier circuit 21. The second amplifier circuit 22 outputs an attenuated analog audio signal to the AD converter 23.

It is to be noted that the number of resistors and switching elements of the second amplifier circuit 22 is not limited to the above-stated number, and the number may be two or less or may be four or more. Additionally, the attenuation amount of the second amplifier circuit 22 is not limited to the above-stated example, and may be able to be changed by an amplifier that is used or an electronic circuit configuring the amplifier. Further, the second amplifier circuit 22 is not be limited to the example in which the attenuation amount of an analog audio signal is changed, and may be configured to amplify a received analog audio signal.

Further, the plurality of resistors R211, R212, and R213 and the plurality of switching elements S211, S212, and S213 of the first amplifier circuit 21 and the plurality of resistors R221, R222, and R223 and the plurality of switching elements S221, S222, and S223 of the second amplifier circuit 22 may be included in one switch IC. As a result, the first amplifier AMP1 and the second amplifier AMP2, by using the switch IC, is able to shorten time required for the gain control (the amplification or the attenuation) of each of the amplifiers.

The AD converter 23 converts into a digital audio signal the analog audio signal received from the second amplifier circuit 22. The AD converter 23 outputs the digital audio signal to the first signal processing circuit 3.

The output side circuit (the second signal processing circuit) 4 receives the digital audio signal from the first signal processing circuit 3 to be described later. The output side circuit 4, as shown in FIG. 3, includes a DSP circuit 41 and a DA converter 42. The DSP circuit 41 performs various types of signal processing such as mixing processing, effect processing, or level adjustment. The DSP circuit 41 receives the digital audio signal to be outputted from the first signal processing circuit 3. The DA converter 42 converts into an analog audio signal the digital audio signal on which the signal processing has been performed by the DSP circuit 41. The DA converter 42 outputs the analog audio signal to an audio device, for example, a speaker, through the output terminal 11 (see FIG. 1).

The control circuit 5 is configured by a CPU and the like. The control circuit 5 executes various programs stored in the memory 6 and implements various functions. The control circuit 5 receives an updated gain value from a gain knob, a scene selector switch for a scene recall, or the like. Additionally, the control circuit 5, as shown in FIG. 1, outputs a target gain value based on the received updated gain value to the first signal processing circuit 3. Additionally, the control circuit 5, when receiving the updated gain value, outputs a switching instruction to the first signal processing circuit 3. The control circuit 5 outputs the target gain value and the switching instruction to the first signal processing circuit 3 by means of serial communication.

It is to be noted that the above-stated serial communication is an example and the control circuit 5 and the first signal processing circuit 3 may be communicated by means of another communication method including wired and wireless communication.

Figure 4:
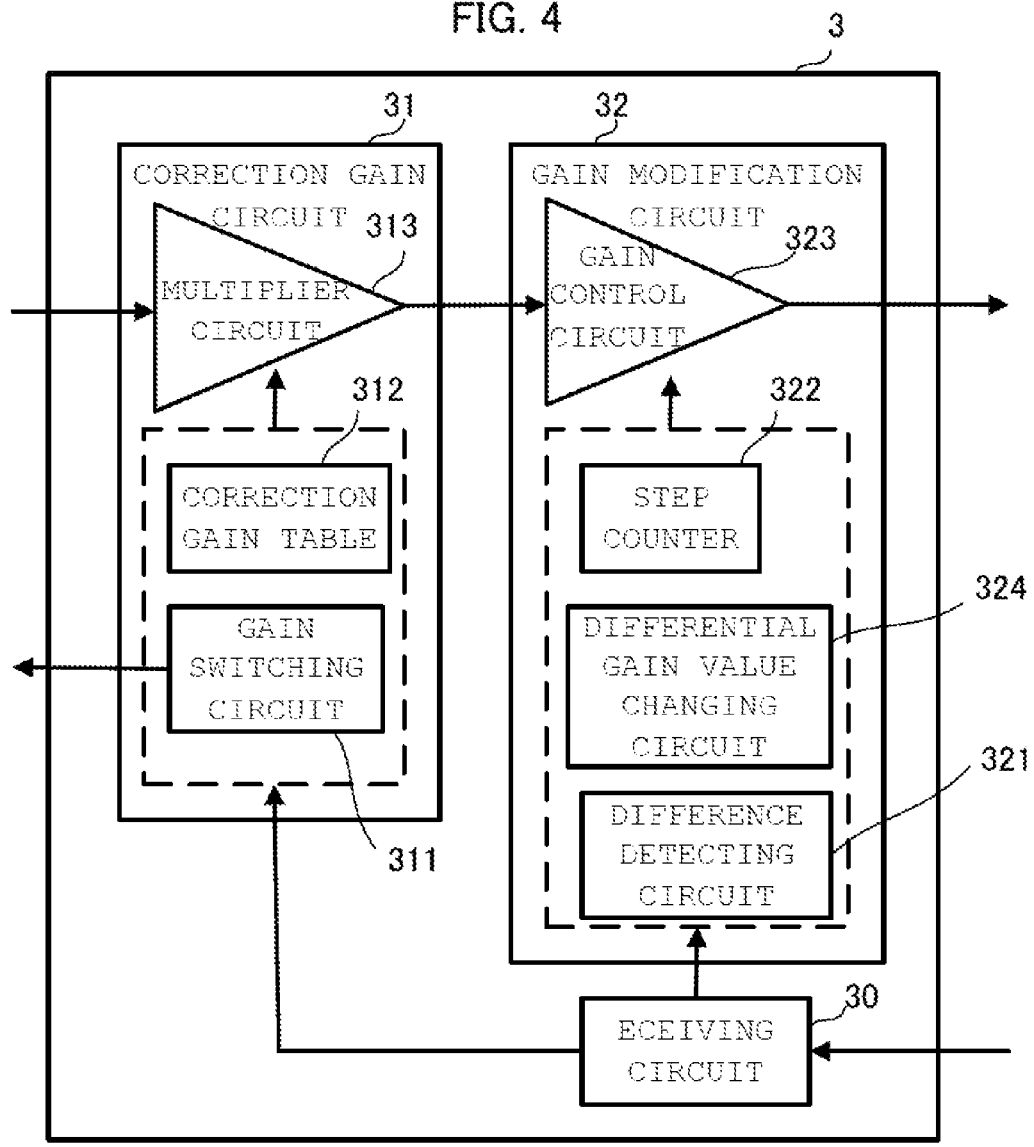
FIG. 4 is a block diagram showing a first signal processing circuit of the audio signal processor.

FIG. 4 is a block diagram showing a configuration of the first signal processing circuit 3 of the audio signal processor 1. The first signal processing circuit 3 is configured by an FPGA (a Field-Programmable Gate Array), a DSP (a Digital Signal Processor), or a microcomputer, for example. The first signal processing circuit 3, as shown in FIG. 4, includes a receiving circuit 30, a correction gain circuit 31, and a gain modification circuit 32.

The receiving circuit 30 receives a switching instruction and a target gain value from the control circuit 5. The receiving circuit 30, when receiving the switching instruction from the control circuit 5, starts operation of the correction gain circuit 31 and the gain modification circuit 32. Additionally, the receiving circuit 30 outputs the target gain value to the correction gain circuit 31.

The correction gain circuit 31 has a gain switching circuit 311, a correction gain table 312, and a multiplier circuit 313.

The gain switching circuit 311, according to the target gain value received from the receiving circuit 30, controls each of the switching elements S20, S211, S212, S213, S221, S222, and S223 of the input side circuit 2 to be the ON state or the OFF state.

More specifically, the gain switching circuit 311 controls the switching element S20, and switches the attenuation amount of the attenuator PAD1 from the present attenuation amount to a target attenuation amount corresponding to the target gain value. The gain switching circuit 311 controls the switching elements S211, S212, and S213, and switches the amplification amount of the first amplifier AMP1 from the present amplification amount to a target amplification amount corresponding to the target gain value. The gain switching circuit 311 controls the switching elements S221, S222, and S223, and switches the attenuation amount of the second amplifier AMP2 from the present attenuation amount to a target attenuation amount corresponding to the target gain value. The gain switching circuit 311 controls each of the switching elements S20, S211, S212, S213, S221, S222, and S223 all at once or almost all at once.

It is to be noted that the present preferred embodiment is not limited to the example in which each of the switching elements S211, S212, S213, S221, S222, and S223 is controlled all at once or almost all at once. The gain switching circuit 311 may control the switching of the switching elements S211, S212, S213, S221, S222, and S223 at different timing.

For example, when a target gain value is +6 dB, the gain switching circuit 311 controls the switching elements S211, S221, and S223 to the ON state, and controls the switching elements S20, S212, S213, and S222 to the OFF state.

In the following description, the total of the attenuation amount of the attenuator PAD1, the amplification amount of the first amplifier AMP1, and the attenuation amount of the second amplifier AMP2 is called an analog gain value.

The input side circuit 2 of the audio signal processor 1 of the present preferred embodiment is a so-called multiplier circuit of an analog type. In the input side circuit 2, the attenuation amount of the attenuator PAD1 is determined only by the ON and OFF states of the switching element S20. Additionally, the amplification amount of the first amplifier AMP1 is determined by a combination of the ON and OFF states of the switching elements S211, S212, and S213. Further, the attenuation amount of the second amplifier AMP2 is determined by a combination of the ON and OFF states of the switching elements S221, S222, and S223.

In the input side circuit 2, when a large number of switching elements are to be used, the resolution of an attenuation amount and an amplification amount is subdivided, which causes an analog gain value to be adjusted more finely. As a result, in the input side circuit 2, the analog gain value is able to be closer to the value of the target gain value.

On the other hand, when the number of switching elements in the input side circuit 2 is reduced, the audio signal processor 1 is able to reduce the size of a circuit board to be used, and cost. However, when the number of switching elements in the input side circuit 2 is reduced, the resolution of an analog gain value may become coarse, which makes it difficult to finely adjust a gain value. In other words, in the audio signal processor 1, when the number of switching elements in the input side circuit 2 is reduced, a difference is generated between an analog gain value and a target gain value.

In the audio signal processor 1 of the present preferred embodiment, in order to achieve the balance between the size of a circuit board and cost, and the resolution of an analog gain value, the multiplier circuit 313 of a digital type that configures the first signal processing circuit 3 and the correction gain table 312 are used. As a result, the audio signal processor 1 of the present preferred embodiment is able to decrease the difference between an analog gain value and a target gain value. The correction gain table 312 is a table showing a correspondence relationship between the analog gain value inputted from the input side circuit 2 and a correction gain value. The correction gain value is a difference between an analog gain value and a target gain value. The multiplier circuit 313 corrects the digital audio signal inputted from the input side circuit 2 with a correction gain value with reference to the correction gain table 312.

More specifically, the multiplier circuit 313, when receiving the digital audio signal inputted from the input side circuit 2, amplifies (or attenuates) the received digital audio signal with a correction gain value corresponding to the analog gain value in the correction gain table 312. The multiplier circuit 313 outputs the digital audio signal corrected with the correction gain value to gain modification circuit 32. It is to be noted that hereinafter a value obtained by adding a correction gain value to an analog gain value is called a total gain value.

Incidentally, in the conventional audio signal processor, when the present (before switching) total gain values (hereinafter referred to as a first total gain value TG1) are changed into updated (after switching) total gain values (hereinafter referred to as a second total gain value TG2) all at once, the sequence of the output waveform of the audio signal is broken and the waveform drastically changes, so that noise has occurred.

Figure 7:
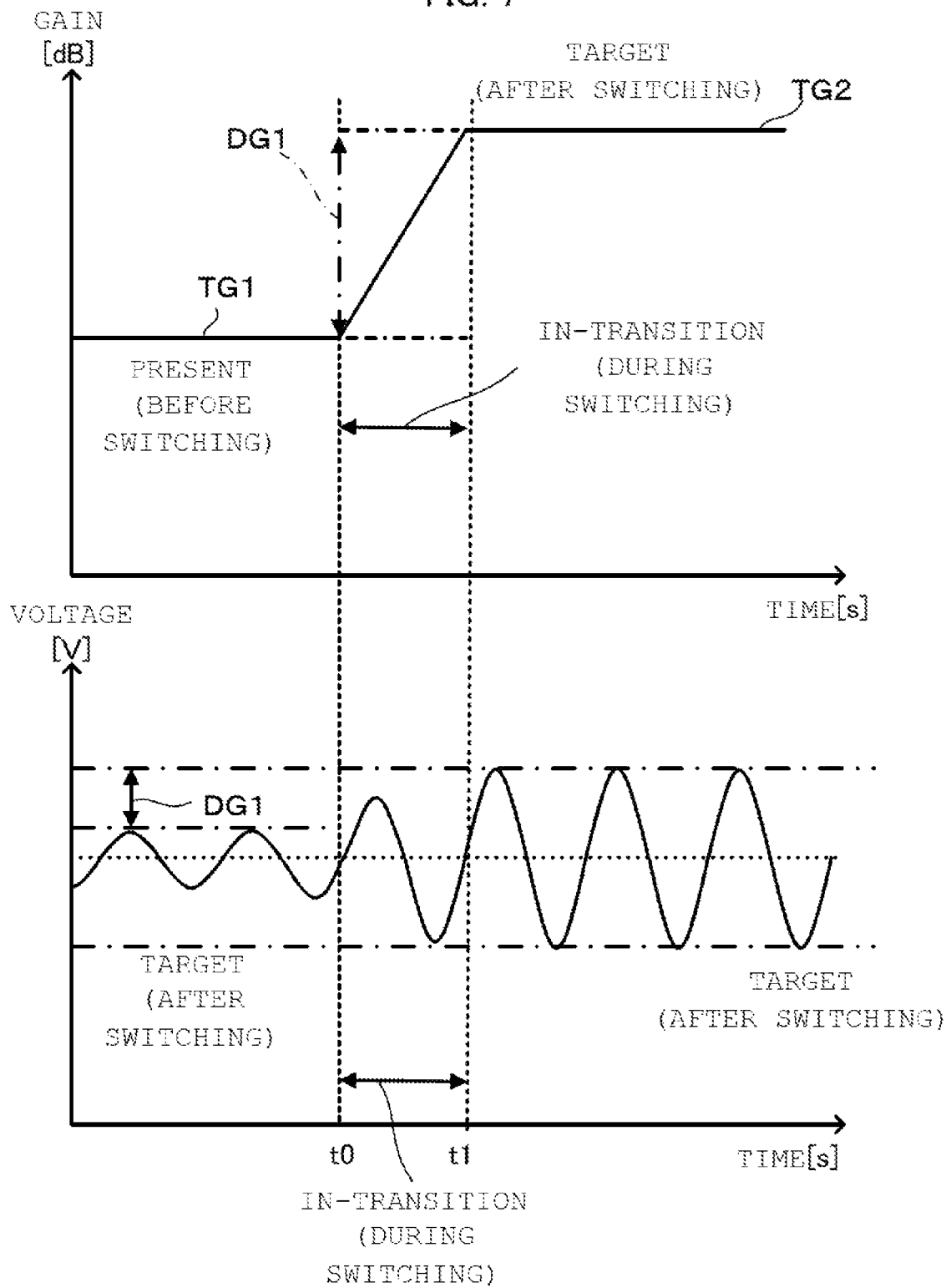
FIG. 7 is a view illustrating an example of a transition from the gain value to be switched to the gain value that has been switched.

Therefore, the audio signal processor 1 of the present preferred embodiment is configured to maintain a waveform sequence by using the gain modification circuit 32. The gain modification circuit 32 will be described with reference to FIG. 5, FIG. 6, and FIG. 7. FIG. 5 is a correspondence table being an example of a transition table and showing an example of a correspondence relationship between a step and a differential gain value DG1 that decreases for each step. FIG. 6 is a correspondence table showing an example of a correspondence relationship between a gain value to be switched and a gain value that has been switched. FIG. 7 is a view illustrating a transition from the gain value to be switched to the gain value that has been switched.

In the upper graph of FIG. 7, the solid line before time t0 (the present) indicates the first total gain value TG1. The solid line during a period (in-transition) from time t0 to time t1 indicates a gain value obtained by adding (subtracting) the differential gain value DG1 to be changed as time passes to the second total gain value TG2. Further, the solid line after time t1 (the target) indicates the second total gain value TG2. The dashed line shown in the upper graph of FIG. 7 indicates the differential gain value DG1 at time t0.

The gain modification circuit 32, as shown in FIG. 5, decreases the differential gain value DG1 as time transitions (a step increases).

The gain modification circuit 32 includes a difference detecting circuit 321, a step counter 322, a gain control circuit 323, and a differential gain value changing circuit 324. In the audio signal processor 1 of the present preferred embodiment, the differential gain value changing circuit 324 has a transition table.

The difference detecting circuit 321, at time t0, detects the differential gain value DG1 being a difference between the first total gain value TG1 and the second total gain value TG2. In other words, the difference detecting circuit 321 detects an initial differential gain value DG1.

The step counter 322 counts a step. The time of one step is 20 μs (microseconds), for example. It is to be noted that the time of one step is not be limited to the above-stated time and may be set to time other than 20 μs.

In the transition table, as shown in FIG. 5, a decrease value (a variable gain value) of the differential gain value DG1 is assigned to each step.

The gain control circuit 323 receives a digital audio signal from the correction gain circuit 31. The gain control circuit 323 corrects the received digital audio signal with a differential gain value DG1.

More specifically, the attenuation amount of the attenuator PAD1 before switching, as shown in FIG. 6, is 0 dB. The amplification amount of the first amplifier AMP1 before switching is +5 dB. The attenuation amount of the second amplifier AMP2 before switching is −6 dB. A correction gain value before switching is +1 dB. The sum of the values, that is, 0 dB is the first total gain value TG1.

On the other hand, the attenuation amount of the attenuator PAD1 after switching is 0 dB. The amplification amount of the first amplifier AMP1 after switching is +24 dB. The attenuation amount of the second amplifier AMP2 after switching is −17 dB. A correction gain value after switching is +3 dB. The sum of the values, that is, +10 dB is the second total gain value TG2. In short, the differential gain value DG1 is 10 dB.

The differential gain value DG1, as shown in FIG. 5 and FIG. 7, decreases for each step from time t0 to time t1 (in-transition). The decrease value of one step is set to 0.05 dB, for example, in the transition table (see FIG. 5).

In the present preferred embodiment, the gain switching circuit 311, at time t0, controls the switching elements S20, S211, S212, S213, S221, S222, and S223 to the ON state or the OFF state based on a target gain value. In other words, the gain switching circuit 311, at time t0, switches the attenuation amount of the attenuator PAD1 before switching, the amplification amount of the first amplifier AMP1 before switching, the attenuation amount of the second amplifier AMP2 before switching, and the correction gain value before switching to the attenuation amount of the attenuator PAD1 after switching, the amplification amount of the first amplifier AMP1 after switching, the attenuation amount of the second amplifier AMP2 after switching, and the correction gain value after switching (see FIG. 6). Additionally, the multiplier circuit 313, at time t0, receives a digital audio signal from the input side circuit 2 and corrects the received digital audio signal with a correction gain value assigned in the correction gain table 312 (see FIG. 7). In short, the correction gain circuit 31, at time t0, switches the first total gain value TG1 to the second total gain value TG2.

The gain modification circuit 32, as shown in FIG. 7, in the in-transition, corrects the digital audio signal received from the multiplier circuit 313 for each step with a differential gain value DG1 assigned in the transition table. The differential gain value DG1, as shown in FIG. 5, decreases by 0.05 dB for each 20 μs (step). In short, at time t0, the differential gain value DG1 is 10 dB. Then, when the number of steps reaches 200 (4 ms) (time t1), the differential gain value DG1 becomes 0 dB (see FIG. 5). The step counter 322 continues counting until the differential gain value DG1 becomes 0 dB. It is to be noted that the step counter 322 is preferably configured to stop counting when the differential gain value DG1 becomes 0 dB.

As described above, in a case in which the first total gain value TG1 is smaller than the second total gain value TG2, the gain control circuit 323, at time t0, subtracts (adds −10 dB) the differential gain value DG1 (10 dB) from the second total gain value TG2 (10 dB). As a result, as shown in FIG. 7, the gain value at time t0 becomes the same value as the first total gain value TG1.

Additionally, in a case in which the first total gain value TG1 is larger than the second total gain value TG2, the gain control circuit 323, at time t0, adds the differential gain value DG1 to the second total gain value TG2. As a result, the gain value at time t0 becomes the same value as the first total gain value TG1.

It is to be noted that the decrease value for each step is not limited to the above-stated value and may be smaller or larger than 0.05 dB. Additionally, the decrease value for each step does not need to be constant. For example, immediately after step start, when the number of steps is from 1 to 10, for example, the decrease value for each step may be set to a value smaller than 0.05 dB. Additionally, before the end of step start, when the number of steps is from 190 to 200, for example, the decrease value for each step may be set to a value smaller than 0.05 dB. Additionally, the number of steps is not limited to the above-stated number and may be a number other than 200 according to at least one of a differential gain value DG1 and a decrease value.

Additionally, for example, a case in which, while the differential gain value DG1 is between time t0 and time t1 (in-transition), the control circuit 5 receives a new updated gain value is assumed. In such a case, time when the new updated gain value is received is newly set to time t0. The difference detecting circuit 321 sets a total gain value at this new time t0 to a first total gain value TG1 and sets a total gain value after an update to a second total gain value TG2, and detects an initial differential gain value DG1.

The differential gain value changing circuit 324 of the gain modification circuit 32 may calculate a transition gain value CG1 for each step instead of a transition table. The gain control circuit 323 may correct the digital audio signal received with the differential gain value DG1 calculated for each step.

For example, in a case in which the first total gain value TG1 is smaller than the second total gain value TG2, and the differential gain value DG1 at time t0 is 10 dB, the gain value for each step may be calculated by the second total gain value−(10 dB−0.05 dB×the number of steps).

Additionally, for example, in a case in which the first total gain value TG1 is larger than the second total gain value TG2, and the differential gain value DG1 at time t0 is 10 dB, the gain value for each step may be formed by the second total gain value+(10 dB−0.05 dB×the number of steps).

Conventionally, in an audio signal processor, when a user switches a gain value, the output waveform of an audio signal has become discontinuous and thus noise may have occurred. In the audio signal processor 1 of the present preferred embodiment, the first total gain value TG1 is switched to the second total gain value TG2 all at once or almost all at once. Then, the audio signal processor 1 corrects the second total gain value TG2 to a digital audio signal with the differential gain value DG1 in a step-like manner as time passes. As a result, in the audio signal processor 1, as shown in a lower graph of FIG. 7, even when a gain value to be switched is changed to a gain that has been switched, a waveform sequence is not broken. Therefore, the audio signal processor 1 of the present preferred embodiment is able to reduce noise in switching a gain value.

Figure 8:
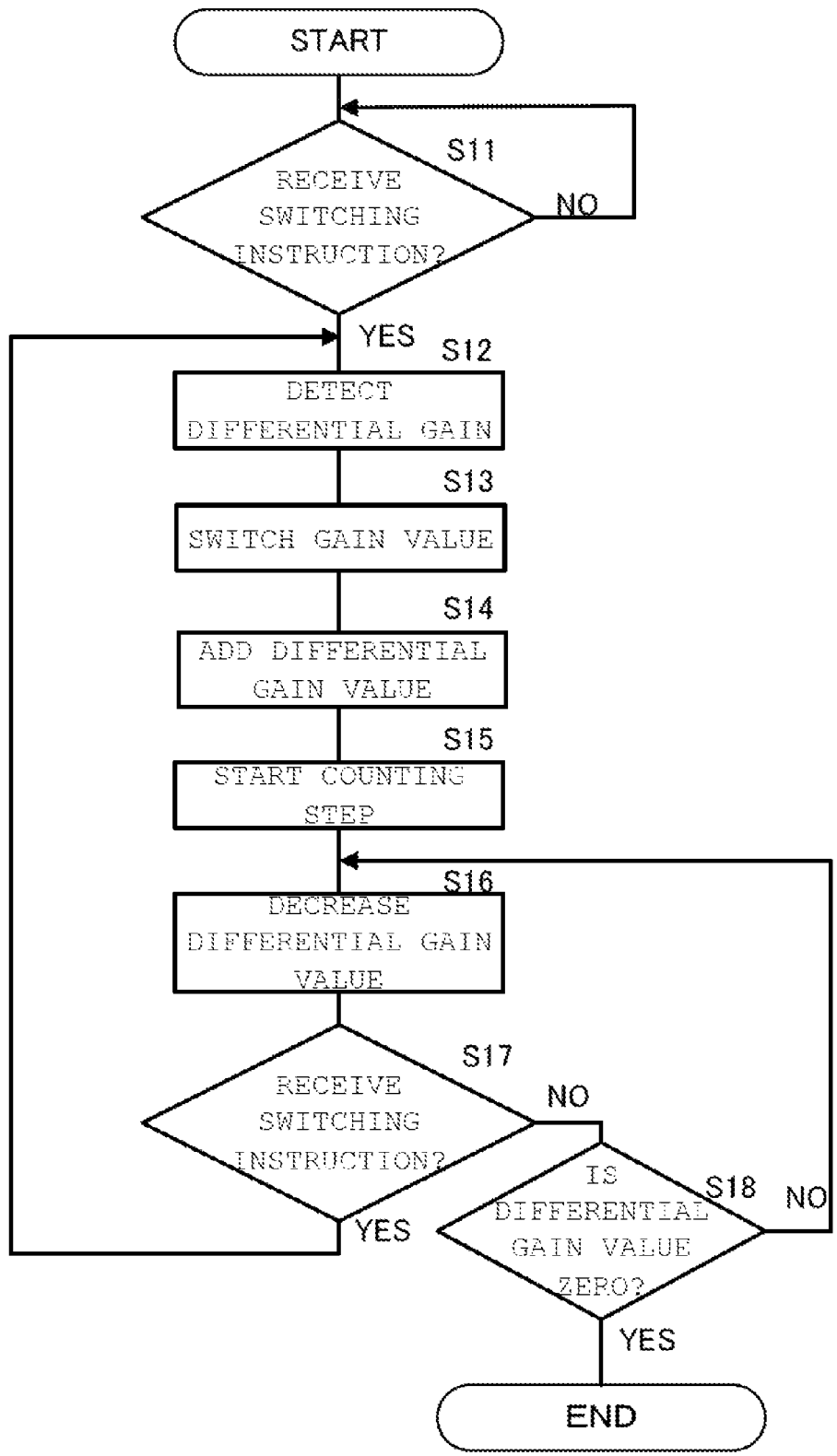
FIG. 8 is a flowchart showing a method of processing an audio signal.

Subsequently, a method of processing an audio signal of the present preferred embodiment will be described with reference to FIG. 8. FIG. 8 is a flow chart showing a method of processing an audio signal. The method of processing an audio signal of the present preferred embodiment receives an analog audio signal from an audio device, for example, a microphone and the like. The method of processing an audio signal, when a gain value is switched by a user, for example, changes the present gain value to a target gain value. In the method of processing an audio signal, various programs stored in the memory 6, for example, are executed, executes a function in the first signal processing circuit 3.

The method of processing an audio signal, when receiving a switching instruction (Step S11: Yes) from the control circuit 5, detects a differential gain value DG1 being a difference between a first total gain value TG1 and a second total gain value TG2 (Step S12). The method of processing an audio signal switches the first total gain value TG1 to the second total gain value TG2 (Step S13). The method of processing an audio signal adds the differential gain value DG1 to the second total gain value TG2 (Step S14). The method of processing an audio signal starts counting a step (Step S15). The method of processing an audio signal, with reference to a transition table (see FIG. 6), decreases the differential gain value DG1 for each step (Step S16). The method of processing an audio signal, in a case of receiving a switching instruction from the control circuit 5 (Step S17: Yes) while decreasing (transitioning) the differential gain value DG1, shifts processing to Step S12.

On the other hand, the method of processing an audio signal, in a case of having not received a switching instruction (Step S17: No) from the control circuit 5 while the differential gain value DG1 decreases (transitions), determines whether or not the differential gain value DG1 is 0 dB (Step S18). In a case in which the differential gain value DG1 is 0 dB (Step S18: Yes), the method of processing an audio signal ends the processing. When the differential gain value DG1 is not 0 dB, the method of processing an audio signal shifts the processing to Step S16.

In the audio signal processor and the method of processing an audio signal of the present preferred embodiment, the gain switching circuit 311 controls the plurality of switching elements S211, S212, and S213 of the first amplifier circuit 21 and the plurality of switching elements S221, S222, and S223 of the second amplifier circuit 22 all at once or almost all at once and corrects the first total gain value TG1 and the second total gain value TG2 with the differential gain value DG1 for each step while the first total gain value TG1 is switched to the second total gain value TG2. Therefore, the audio signal processor and the method of processing an audio signal of the present preferred embodiment are able to reduce noise in switching a gain value.

It is to be noted that the audio signal processor 1 is not limited to the example in which the plurality of switching elements S211, S212, and S213 of the first amplifier circuit 21, and the plurality of switching elements S221, S222, and S223 of the second amplifier circuit 22 are controlled by the gain switching circuit 311 all at once or almost all at once. The audio signal processor 1 may control, at different timing, the plurality of switching elements S211, S212, and S213 of the first amplifier circuit 21, and the plurality of switching elements S221, S222, and S223 of the second amplifier circuit 22 by the gain switching circuit 311.

The audio signal processor 1 is able to make a start timing of switching to a target amplification amount the first amplifier AMP1 and a start timing of switching to a target attenuation amount of the second amplifier AMP2 different from each other.

Figure 9:
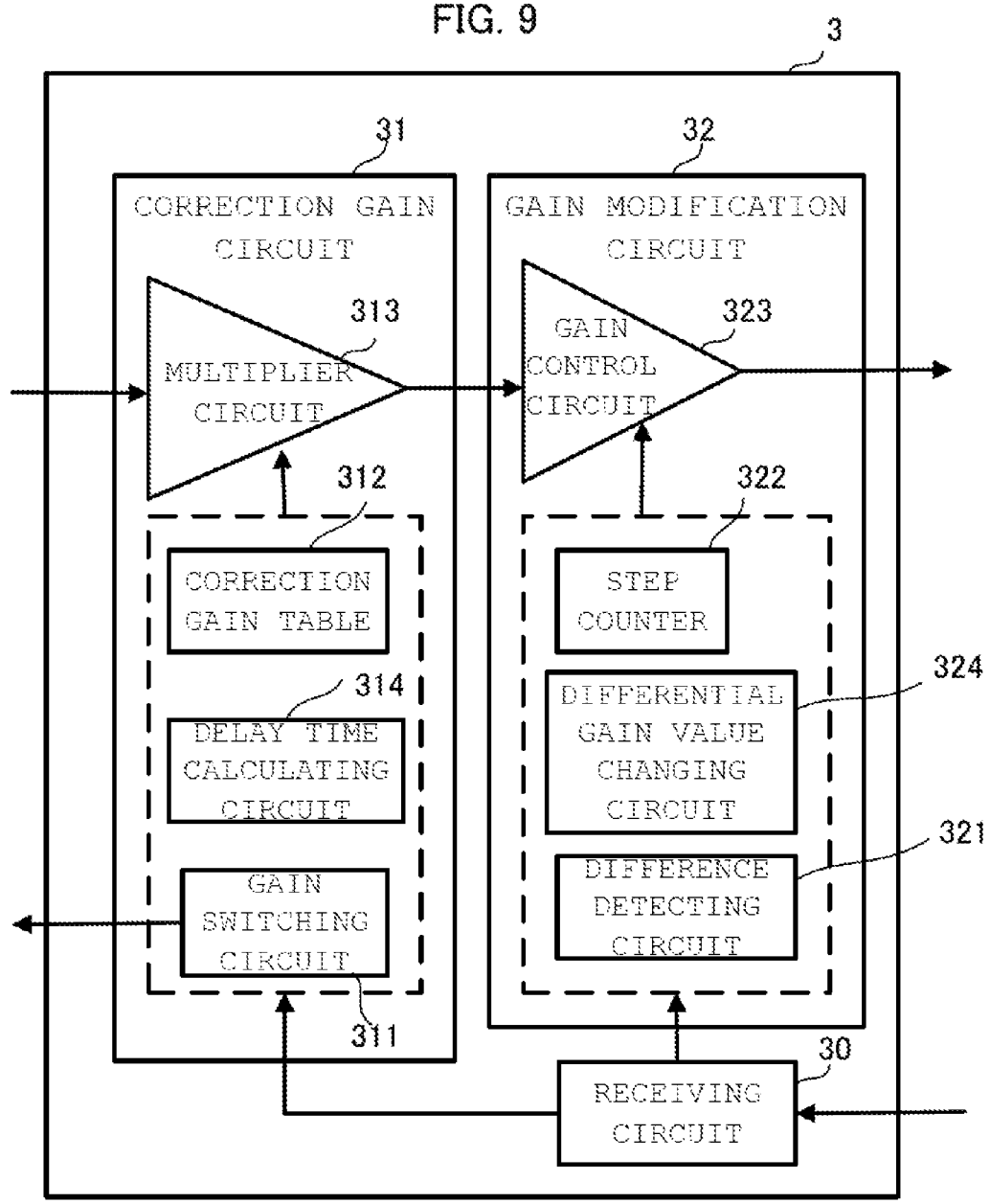
FIG. 9 is a block diagram in which a delay time calculating circuit is added to the first signal processing circuit of the audio signal processor shown in FIG. 4.
Figure 10:
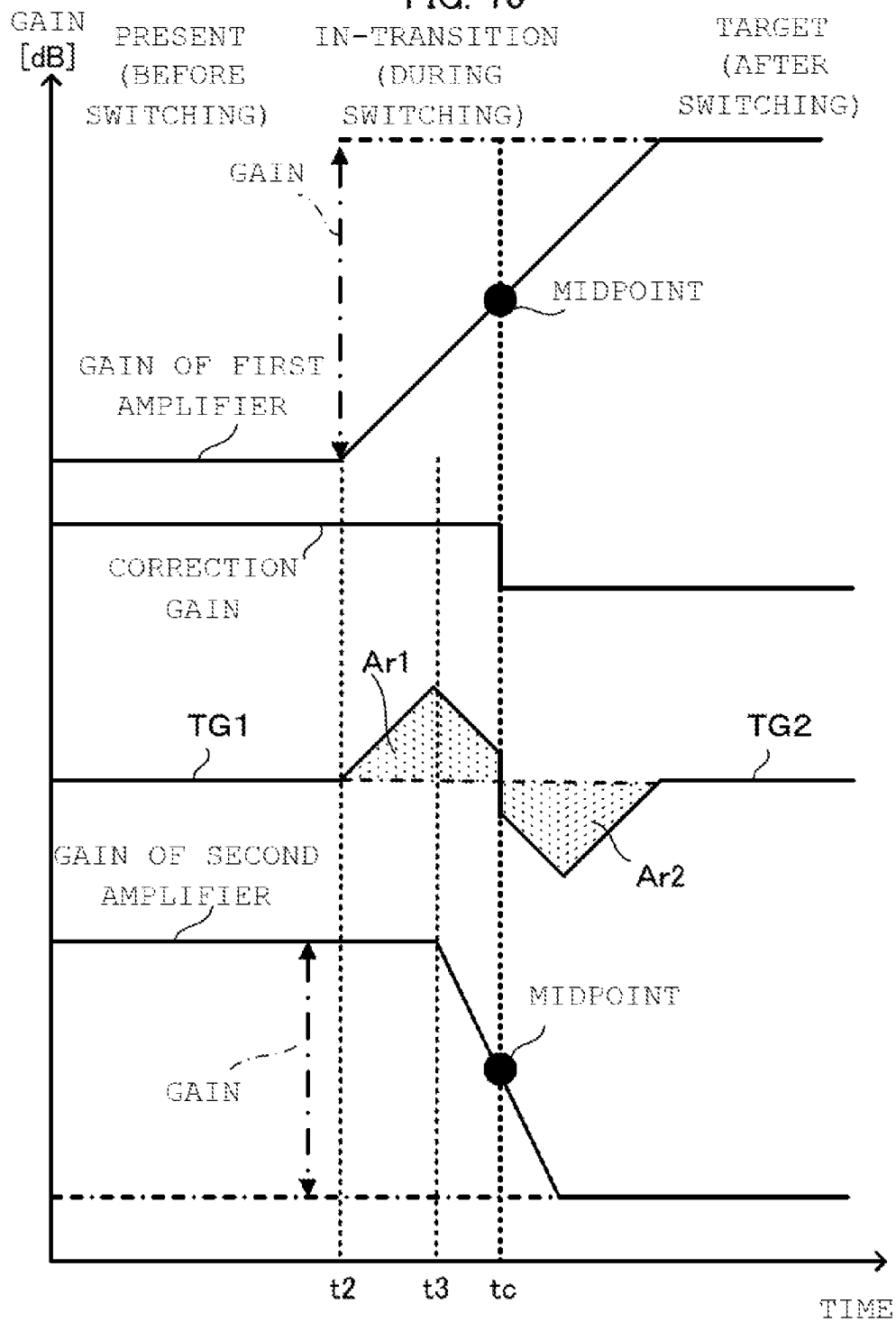
FIG. 10 is a diagram showing a first amplifier, a second amplifier, a correction gain circuit, and a temporal relationship between a total gain and a gain.

This example will be described in more detail. FIG. 9 is a block diagram in which a delay time calculating circuit 314 is added to the first signal processing circuit 3 of the audio signal processor 1 shown in FIG. 4. FIG. 10 is a diagram showing the first amplifier AMP1, the second amplifier AMP2, the correction gain circuit 31, and a relationship with a total gain. It is to be noted that, in the following description, the start timing of switching to the target amplification amount (or a target attenuation amount) is called start time.

The gain switching circuit 311 delays the start time t3 of the second amplifier AMP2 from the start time t2 of the first amplifier AMP1 based on delay time calculated by the delay time calculating circuit 314 shown in FIG. 9.

The delay time will be described. The time required for switching of the gain value of the second amplifier AMP2, as shown in FIG. 10, is shorter than the time required for switching of the gain value of the first amplifier AMP1. In such a case, the delay time calculating circuit 314 calculates a timing (a midpoint) (hereinafter referred to as the midpoint of the first amplifier AMP1) of half of the time required for switching of the gain value of the first amplifier AMP1 and a timing (a midpoint) (hereinafter referred to as the midpoint of the second amplifier AMP2) of half of the time required for switching of the gain value of the second amplifier AMP2. The delay time calculating circuit 314 calculates a time difference generated between the start time of the first amplifier AMP1 and the start time of the second amplifier AMP2 such that the midpoint of the first amplifier AMP1 and the midpoint of the second amplifier AMP2 are the same time tc. As a result, the start time t3 of the second amplifier AMP2 is later than the start time t2 of the first amplifier AMP1 only by delay time.

Additionally, as shown in FIG. 10, the total area of an area Ar1 and an area Ar2 being an integral value until the first total gain value TG1 is switched to the second total gain value TG2 corresponds to the size of the noise that occurs while the total gain switches.

Figure 11:
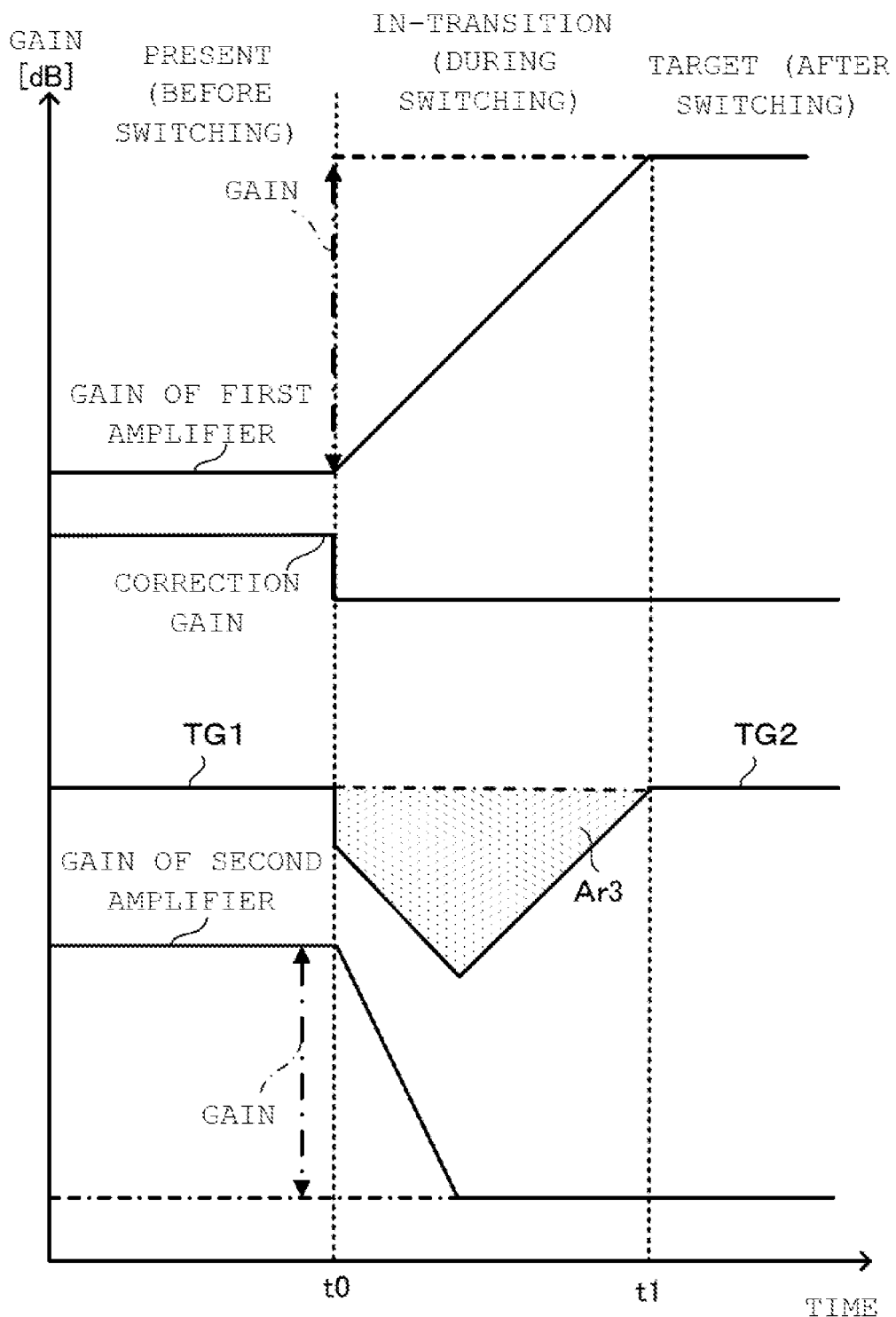
FIG. 11 is a diagram showing a first amplifier, a second amplifier, a correction gain circuit, and a temporal relationship between a total gain and again according to a comparative example.

FIG. 11 is a diagram showing a first amplifier, a second amplifier, a correction gain circuit, and a temporal relationship between a total gain and a gain according to a comparative example. This comparative example is an example of a case in which the plurality of switching elements S211, S212, and S213 of the first amplifier circuit 21, and the plurality of switching elements S221, S222, and S223 of the second amplifier circuit 22 all at once or almost all at once.

When the example shown in FIG. 10 and the comparative example shown in FIG. 11 are compared, the total area of the area Ar1 and the area Ar2 of the example shown in FIG. 10 is smaller than an area Ar3 of the comparative example shown in FIG. 11.

Therefore, the audio signal processor 1, by delaying start time t3 of the second amplifier AMP2, is able to further reduce noise that occurs by the time when the first total gain value TG1 is switched to the second total gain value TG2.

In addition, the above explanations of the preferred embodiments and modification examples are nothing more than illustrative in any respect, and are not restrictive. Scope of the present invention is indicated by claims rather than the above embodiments. Further, the scope of the present invention includes all modifications within the scopes of the claims and within the meanings and scopes of equivalents.

What is claimed is:

1. An audio signal processor comprising:
   a difference detecting circuit that detects a differential gain value being a difference between a first total gain value and a second total gain value, the first total gain value being a gain value to be switched, the second total gain value being the gain value that has been switched;
   a gain switching circuit that switches the first total gain value to the second total gain value;
   a differential gain value changing circuit that decreases the differential gain value as time passes after the first total gain value is switched to the second total gain value by the gain switching circuit; and
   a gain control circuit that corrects an inputted signal with the differential gain value that decreases as time passes after the first total gain value is switched to the second total gain value by the gain switching circuit.

2. The audio signal processor according to claim 1, further comprising:
   a first signal processing circuit that is configured by the difference detecting circuit, the differential gain value changing circuit, and the gain control circuit and outputs a signal; and
   a second signal processing circuit that performs signal processing on the signal that has been outputted from the first signal processing circuit.

3. The audio signal processor according to claim 1, wherein the differential gain value changing circuit decreases the differential gain value in a step-like manner.

4. The audio signal processor according to claim 3, wherein the differential gain value changing circuit includes a transition table to which a variable gain value is assigned for each of steps and decreases the differential gain value according to a decrease value of the variable gain value assigned for each of the steps.

5. The audio signal processor according to claim 3, wherein the differential gain value changing circuit calculates the differential gain value for each of steps and decreases the differential gain value for each of the steps.

6. The audio signal processor according to claim 1, wherein the differential gain value changing circuit decreases the differential gain value until the differential gain value becomes zero.

7. The audio signal processor according to claim 1, further comprising a receiving circuit that receives a switching instruction to switch from the first total gain value to the second total gain value.

8. The audio signal processor according to claim 7, wherein the difference detecting circuit, when the receiving circuit receives the switching instruction, detects the differential gain value, using a present gain value as the first total gain value.

9. The audio signal processor according to claim 7, wherein the receiving circuit receives the switching instruction via serial communication.

10. The audio signal processor according to claim 1, further comprising:
    a first amplifier; and
    a second amplifier of which time required for switching of the gain value is shorter than time of the first amplifier, wherein the gain switching circuit switches gain value switching start time of the second amplifier later than gain value switching start time of the first amplifier.

11. A method of processing an audio signal, comprising:
    detecting a differential gain value being a difference between a first total gain value and a second total gain value, the first total gain value being a gain value to be switched, the second total gain value being the gain value that has been switched;
    switching the first total gain value to the second total gain value;
    decreasing the differential gain value as time passes after the first total gain value is switched to the second total gain value; and
    correcting the second total gain value with the differential gain value that decreases as time passes.

12. The method of processing an audio signal according to claim 11, further comprising decreasing the differential gain value in a step-like manner.

13. The method of processing an audio signal according to claim 12, further comprising decreasing the differential gain value for each of steps based on a transition table to which a variable gain value is assigned for each of the steps.

14. The method of processing an audio signal according to claim 12, further comprising calculating the differential gain value for each of the steps.

15. The method of processing an audio signal according to claim 11, further comprising decreasing the differential gain value until the differential gain value becomes zero.

16. The method of processing an audio signal according to claim 11, further comprising receiving a switching instruction to instruct to switch the first total gain value to the second total gain value.

17. The method of processing an audio signal according to claim 16, further comprising detecting, when receiving the switching instruction, the differential gain value, using a present gain value as the first total gain value.

18. The method of processing an audio signal according to claim 16, further comprising receiving the switching instruction via serial communication.

19. The method of processing an audio signal according to claim 11, further comprising switching gain value switching start time of a second amplifier later than gain value switching start time of a first amplifier, the second amplifier requiring for gain value switching time shorter than gain value switching time of the first amplifier.

* * * * *